United States Patent [19]
Gardner et al.

[11] Patent Number: 6,146,983
[45] Date of Patent: Nov. 14, 2000

[54] METHOD OF MAKING SEMICONDUCTOR DEVICE HAVING SACRIFICIAL SALICIDATION LAYER

[75] Inventors: Mark I. Gardner, Cedar Creek; Frederick N. Hause, Austin, both of Tex.; Charles E. May, Gresham, Oreg.

[73] Assignee: Advanced Micro Devices, Inc., Austin, Tex.

[21] Appl. No.: 09/193,619

[22] Filed: Nov. 17, 1998

[51] Int. Cl.⁷ .................................................. H01L 21/3205
[52] U.S. Cl. ........................ 438/586; 438/655; 438/683; 438/786
[58] Field of Search ..................... 438/586, 627, 438/630, 649, 651, 653, 655, 664, 683, 786

[56] References Cited

U.S. PATENT DOCUMENTS

| | | | |
|---|---|---|---|
| 4,784,973 | 11/1988 | Stevens et al. | 438/649 |
| 5,399,526 | 3/1995 | Sumi | 438/683 |
| 5,567,562 | 10/1996 | Nishio | 438/651 |

*Primary Examiner*—T. N. Quach
*Attorney, Agent, or Firm*—Williams, Morgan & Amerson, P.C.

[57] ABSTRACT

The present invention is directed to a transistor having a stacked silicide metal and method of making same. In general, the method comprises forming a layer of nitrogen-bearing silicon dioxide above the gate conductor and the source and drain regions of a transistor. In one illustrative embodiment, the method further comprises forming a layer of titanium above at least the surface of the gate conductor and the source and drain regions. Thereafter, a layer of cobalt is formed above the layer of titanium. The transistor is then subjected to a heat treating process such that at least the layer of cobalt forms a metal silicide. Also disclosed herein is a partially formed transistor comprised of a gate conductor, a source region and a gate region. In one illustrative embodiment, the transistor is further comprised of a layer of nitrogen-bearing silicon dioxide formed above the gate conductor and the source and drain regions. The transistor further comprises a layer of titanium positioned adjacent the layer of nitrogen-bearing silicon dioxide and a layer of cobalt positioned adjacent the layer of titanium.

16 Claims, 3 Drawing Sheets

METHOD OF MAKING SEMICONDUCTOR DEVICE HAVING SACRIFICIAL SALICIDATION LAYER

BACKGROUND OF THE INVENTION

1. Field of the Invention

The present invention is generally directed to the field of semiconductor processing, and, more particularly, to a method for making a semiconductor device having a sacrificial salicidation layer that assists in reducing junction consumption during salicidation.

2. Descripton of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor, e.g., channel length, junction depths, gate dielectric thickness, etc., are reduced. For example, all other things being equal, the smaller the channel length of the transistor, the faster the transistor will operate. Thus, there is a constant drive to reduce the size or scale of the components of a typical transistor to increase the overall speed of the transistor, as well as integrated circuit devices incorporating such transistors. However, the reduction in the channel length also requires a reduction in the depth of the source and drain regions adjacent the gate conductor.

Another operation that is performed on traditional semiconductor devices is known as salicidation. In general, salicidation involves the process of forming a layer of metal, e.g., titanium, above the gate conductor and source/drain regions of a transistor device, and, thereafter, subjecting the device to a heat treatment process such that a metal silicide, e.g., titanium silicide, is formed where the titanium is exposed to polysilicon. The purpose of the salicidation process is to, among other things, reduce the resistance of the components subject to the salicidation process. However, the traditional salicidation process has become problematic with modern semiconductor devices that have shallow source/drain junctions, e.g., junction depths on the order of 1000 Å or less. In particular, during such salicidation processes, some of the existing source/drain regions are consumed. Typically, this consumption may be on the order of twice the thickness of the metal silicide. Such consumption acts to reduce the dopant present in the source/drain regions and adversely impacts the electrical performance characteristics of the source/drain regions, and ultimately, the performance of the semiconductor device. Given the fact that source/drain regions in modern semiconductor devices are already made very shallow, further reductions in these regions during the salicidation process is undesirable.

The present invention is directed to a semiconductor device that minimizes or reduces some or all of the aforementioned problems and a method of making same.

SUMMARY OF THE INVENTION

The present invention is directed to a semiconductor device, for example, a transistor, having a sacrificial layer useful in the salicidation processes, and a method for making same. In one illustrative embodiment, the method is comprised of forming a layer of silicon dioxide above the gate conductor and the source and drain regions, forming a layer of a first metal above the layer of silicon dioxide. Thereafter, the transistor is heated to a temperature and for a time sufficient to cause at least a portion of the layer of metal to form a metal silicide.

The present invention is also directed to a partially formed semiconductor device, e.g., a transistor, having a unique structure. The transistor is comprised of silicon dioxide formed above the gate conductor and the source and drain regions of the transistor. The device is further comprised of a layer of a first metal positioned adjacent at least the gate conductor and the source and drain regions.

BRIEF DESCRIPTION OF THE DRAWINGS

The invention may be understood by reference to the following description taken in conjunction with the accompanying drawings, in which like reference numerals identify like elements, and in which.

Figure 1:
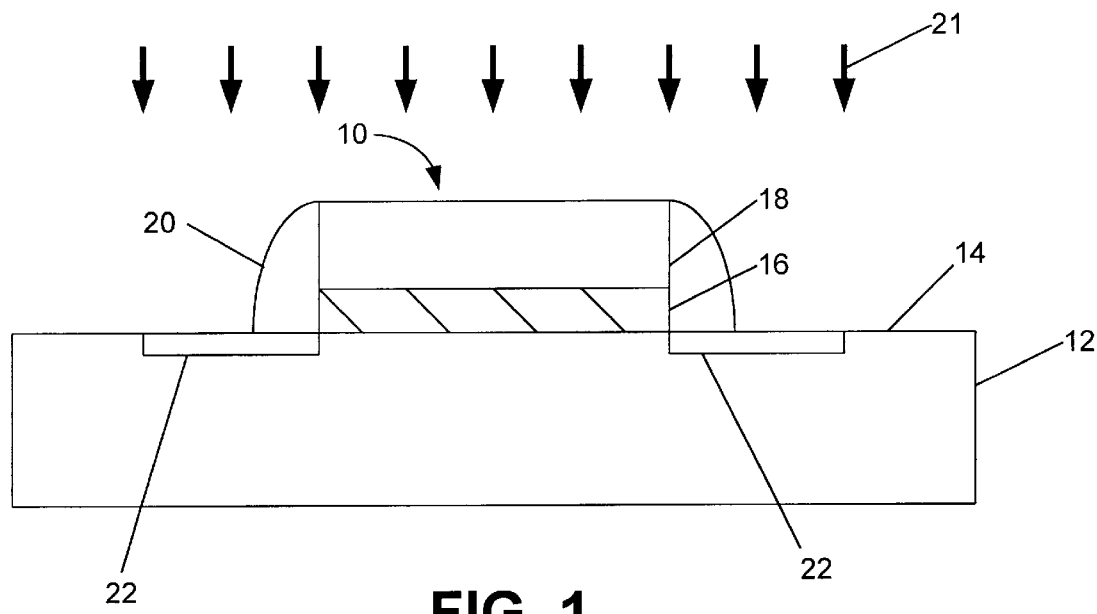
FIG. 1 is a cross-sectional view of an illustrative partially formed semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a semiconductor device having a sacrificial layer that can be used to reduce the consumption of source/drain regions during salicidation processes, and a method for making same. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As shown in FIG. 1, a partially formed field effect transistor 10 is formed above a surface 14 of a semiconducting substrate 12. The transistor 10 is comprised of a gate dielectric 16, a gate conductor 18, a plurality of sidewall spacers 20, and regions 22 that have been subjected to a light doping ion implantation process, as indicated by arrows 21, with the appropriate dopant atoms, e.g., arsenic for NMOS technology. The particular materials and techniques used to form the various components of the transistor 10 may be any of a variety of known materials and techniques for forming these components, and, thus, these materials and techniques should not be considered limitations of the present invention.

For example, the gate dielectric 16 may be comprised of a variety of materials, such as silicon dioxide, that may be thermally grown or deposited using known techniques. Similarly, the gate conductor 18 may be comprised of a variety of materials, such as polysilicon, that may be formed by a chemical vapor deposition (CVD) process. Traditionally, the gate dielectric 16 and the gate conductor 18 will be formed from patterned process layers deposited above the surface 14 of the semiconducting substrate 12. The sidewall spacers 20 may be formed by the deposition of a layer of the appropriate spacer material followed by an anisotropic etch of that material to result in the spacers 20 shown in FIG. 1. The regions 22 of the transistor 10 may be formed by subjecting the transistor 10 to an ion implantation process wherein the dopant concentration ranges from approximately $8 \times 10^{13} - 9 \times 10^{14}$ ions/cm$^2$ of the appropriate dopant material, i.e., arsenic for NMOS technology, at an energy level of 2–20 keV.

Figure 2:
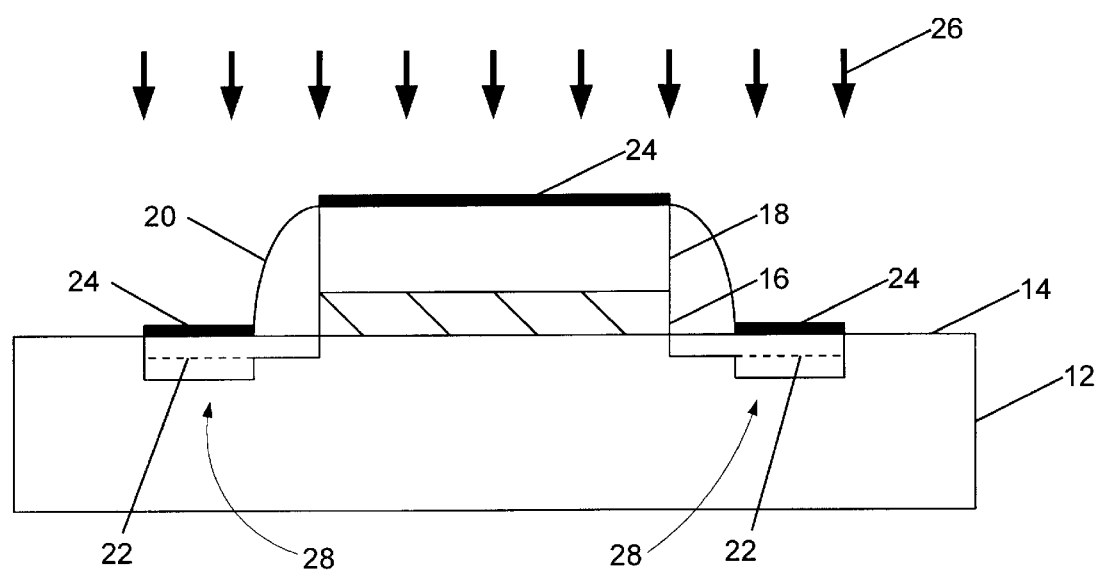
FIG. 2 is a cross-sectional view of the device shown in FIG. 1 after a sacrificial salicidation layer has been formed on parts thereof.

As shown in FIG. 2, a sacrificial layer 24 is formed above the gate conductor 18 as well as the implant regions 22. The sacrificial layer 24 may be comprised of a variety of materials and formed by a variety of known techniques. For example, the sacrificial layer 24 may be comprised of silicon dioxide or a nitrogen-bearing silicon dioxide. The nitrogen may be added to the silicon dioxide to slow the rate of formation and to make the sacrificial layer 24 more uniform. In one illustrative embodiment, the sacrificial layer 24 is comprised of a nitrogen-bearing silicon dioxide having a thickness ranging from approximately 15–30 Å. This illustrative embodiment may be formed in a rapid thermal anneal process in the presence of nitric oxide (NO), nitrous oxide ($N_2O$), or ammonium ($NH_4$), or combinations thereof, at a temperature ranging from approximately 750–900° C. for approximately 5–30 seconds. Alternatively, the sacrificial layer 24 could be formed by a deposition process in the presence of nitric oxide (NO), nitrous oxide ($N_2O$), or ammonium ($NH_4$), or combinations thereof. If the sacrificial layer 24 is deposited, then the deposited layer would extend over the sidewall spacers 20 as well.

Thereafter, a second ion implantation process is performed, as indicated by arrows 26, to complete formation of a source/drain regions 28. This process results in the source/drain regions 28 having the familiar LDD (lightly doped drain) structure. Of course, the formation of source/drain regions 28 having this LDD structure is not required to practice the present invention. The concentration of dopant atoms during this implantation process may range from $4-9 \times 10^{15}$ ions/cm$^2$ and the implantation energy level may be varied from 2–15 keV. The appropriate dopant atoms would have to be selected for the appropriate technology involved, e.g., arsenic for NMOS technology, boron for PMOS technology.

Figure 3:
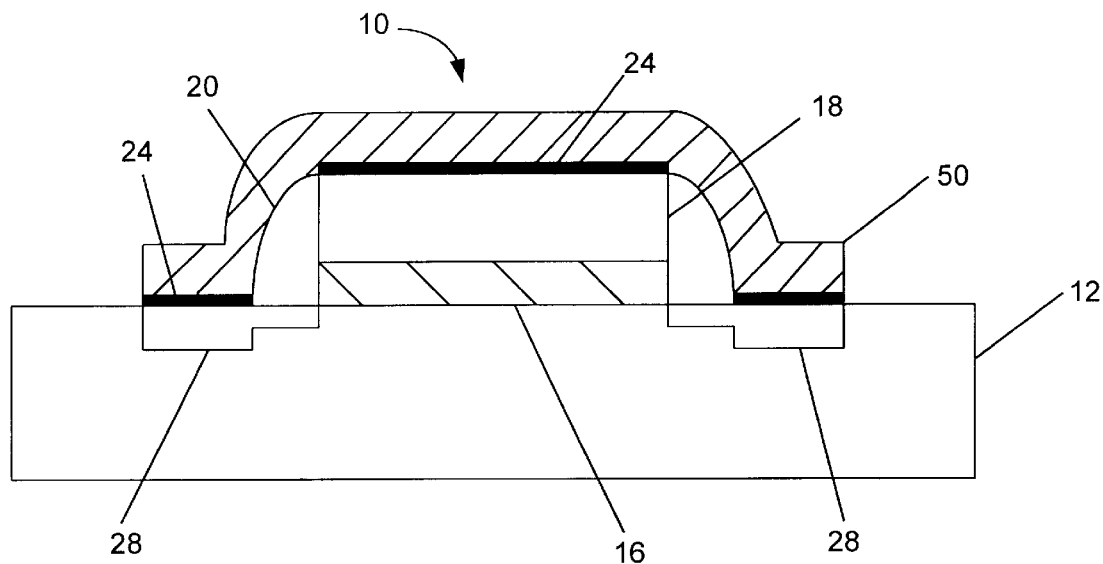
FIG. 3 is a cross-sectional view of the device shown in FIG. 2 after a single layer of metal has been formed thereon.
Figure 4:
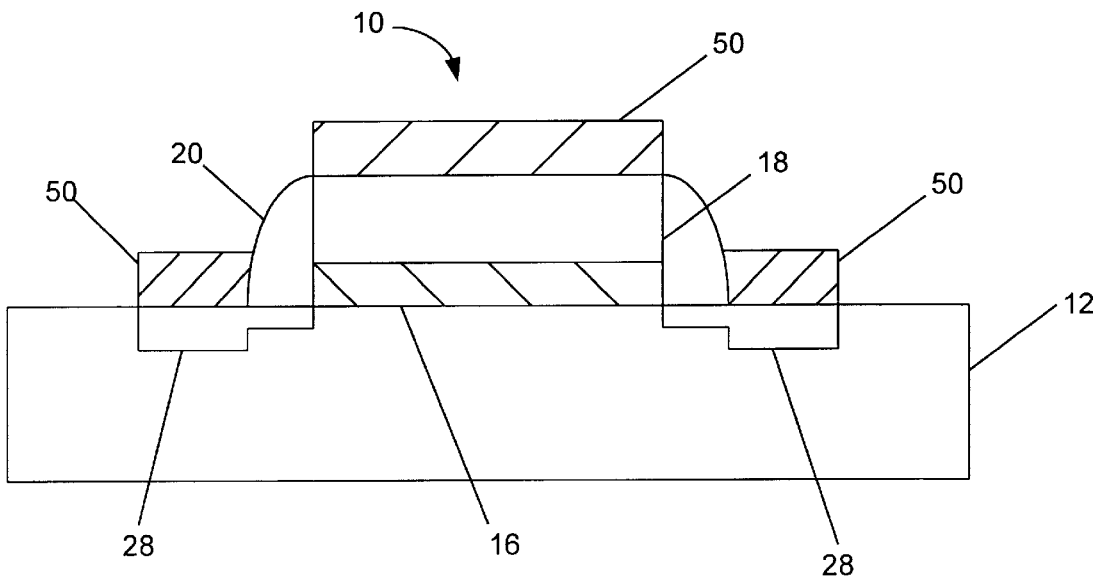
FIG. 4 is a cross-sectional view of one illustrative embodiment of a semiconductor device made in accordance with the present invention.

One illustrative embodiment of the present invention will now be described with respect to FIGS. 3 and 4. As shown therein, a process layer 50 is formed above the transistor 10. The process layer 50 may be comprised of a variety of metals that may be used in a salicidation process, e.g., titanium, nickel, platinum, cobalt, or other like materials. As a general guideline, a single process layer 50 may be used on transistors having a feature size greater than approximately 0.18 microns. The thickness of the process layer 50 may be varied as a matter of design choice. In one illustrative embodiment, the process layer 50 is comprised of titanium having a thickness ranging from approximately 150–300 Å. The process layer 50 may be formed by any of a variety of known techniques for forming such layers, e.g., chemical vapor deposition (CVD), low pressure chemical vapor deposition (LPCVD), sputtering, etc.

Next, the device 10 is subjected to a heat treating process. For example, the device 10 may be subjected to a rapid thermal anneal process at a temperature ranging from approximately 650–800° C. for a time period of approximately 30–60 seconds. This heat treating process may be carried out in an RTA chamber in the presence of a nitrogen gas. During this process, the process layer 50 is converted to a metal silicide, e.g., titanium silicide. The conversion of the process layer 50 to a silicide may be less than complete, i.e., only a portion of the thickness of the process layer 50 may be converted to a silicide. Alternatively, the entirety of the process layer 50 may be converted to a silicide. During this process, the sacrificial layer 24 formed above the gate conductor 18 and the source/drain regions 28 is substantially consumed by the process layer 50 comprised of, for example, titanium. As will be recognized by those skilled in the art, the portions of the process layer 50 in contact with the sidewall spacers 20 remain unreacted, and may be removed by a subsequent acid rinse, for example, $H_2O_2$ plus water, to result in the structure shown in FIG. 4.

Figure 5:
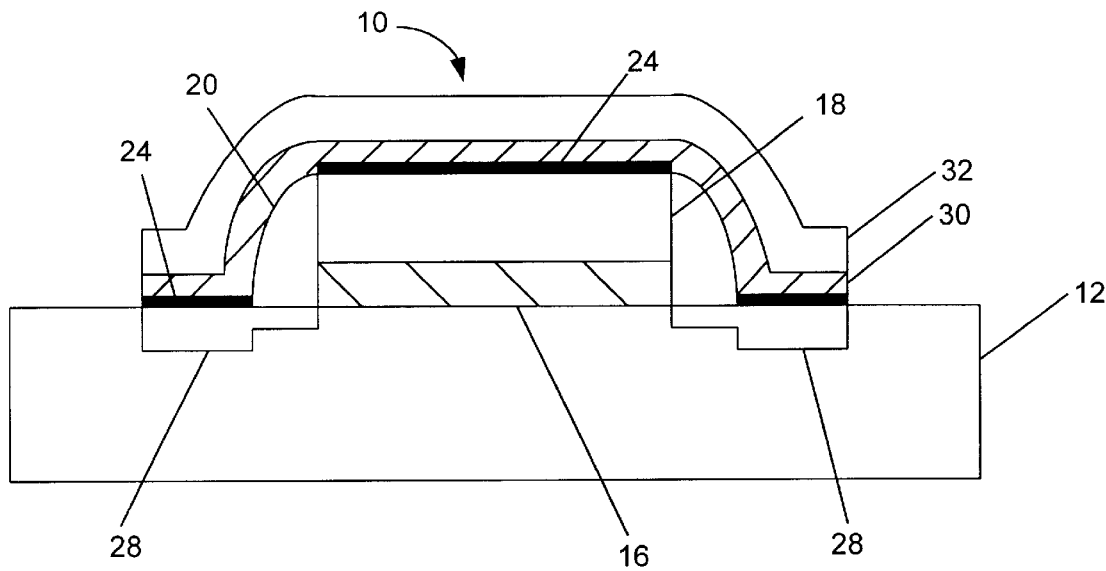
FIG. 5 is a cross-sectional view of the device shown in FIG. 2 after multiple layers of metal have been formed above the device.
Figure 6:
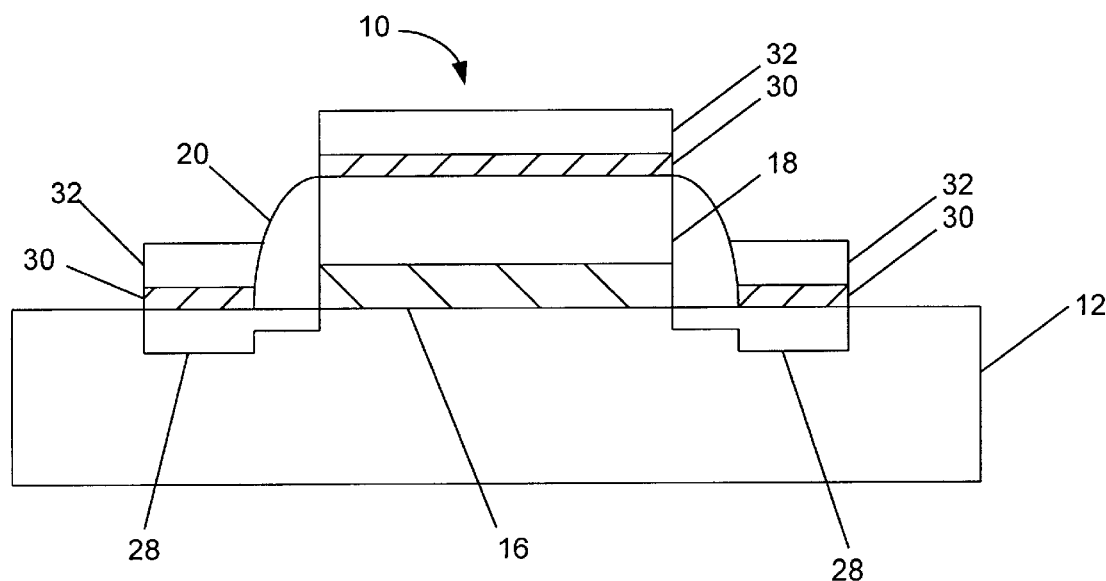
FIG. 6 is a cross-sectional view of another illustrative embodiment of a semiconductor device made in accordance with the present invention.

Another illustrative embodiment of the present invention is disclosed in FIGS. 5 and 6. As shown therein, process layers 30 and 32 are formed above the transistor 10. The process layers 30, 32 are comprised of metals, at least a portion of which will ultimately be converted to metal silicide during a salicidation process. Again, as a general guideline, the use of the multiple process layers 30, 32 during salicidation may be useful on devices having a feature size less than approximately 0.18 microns. The process layers 30, 32 may be formed from a variety of metals that may be used in a salicidation process, e.g., cobalt, titanium, nickel, platinum, etc. Typically, in this dual layer system, the upper layer 32 will be formed of cobalt. Of course, other combinations of these and similar materials may be employed. In one illustrative embodiment, the process layer 30 is comprised of a layer of titanium having a thickness ranging from approximately 50–100 Å, and the process layer 32 is comprised of cobalt having a thickness ranging from approximately 100–200 Å. Both the process layers 30 and 32 may be formed by a variety of known techniques for forming such layers, including, but not limited to, chemical vapor deposition (CVD), sputtering, or like processes. Additionally, if desired, the process layers 30 and 32 may be formed in situ.

The device 10 is then subjected to a heat treating process. For example, the transistor 10 may be subjected to a rapid thermal anneal process at a temperature ranging from approximately 650–800° C. for a time period of approximately 30–60 seconds. This heat treating process may be carried out in an RTA chamber in the presence of a nitrogen gas. During this process, some or all of the process layers 30, 32 are converted to a metal silicide, e.g., titanium silicide and cobalt silicide. The conversion of these process layers 30, 32 to a silicide may be less than complete, i.e., only a portion of the thickness of these layers may be converted to a silicide, or the entirety of these layers may be converted to a silicide. During this process, the sacrificial layer 24 formed above the gate conductor 18 and the source/drain regions 28 is substantially consumed by the process layer 30 comprised of, for example, titanium. As will be recognized by those skilled in the art, the portions of the process layer 30 in contact with the sidewall spacers 20 remain unreacted and may be removed by a subsequent acid rinse, for example, $H_2O_2$ plus water, to result in the structure shown in FIG. 6.

Through the present technique, the consumption of the source/drain regions 28 during the salicidation process may be reduced by as much as a factor of two, thereby improving device performance. Thus, the present technique provides for faster and more efficient semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a metal silicide above a transistor comprised of a gate conductor, a source region and a gate region, the method comprising:
    thermally growing a layer of nitrogen-bearing silicon dioxide selectively above said gate conductor and said source and drain regions;
    depositing a layer of a first metal above at least said layer of nitrogen-bearing silicon dioxide; and
    heating said transistor to a temperature and for a time sufficient to cause at least said layer of a first metal to form a metal silicide.

2. The method of claim 1, wherein thermally growing a layer of nitrogen-bearing silicon dioxide selectively above said gate conductor and said source and drain regions comprises forming a layer of silicon dioxide in the presence of at least one of nitric oxide (NO), nitrous oxide ($NO_2$), and ammonium ($NH_3$) selectively above said gate conductor and said source and drain regions.

3. The method of claim 1, wherein depositing a layer of a first metal above at least said layer of silicon dioxide comprises depositing a layer comprised of at least one of titanium, nickel, and platinum above at least said layer of silicon dioxide.

4. The method of claim 1, further comprising depositing a layer of a second metal above said layer of a first metal, and wherein heating said transistor comprises heating said transistor to a temperature and for a time sufficient to cause at least said second layer to form a metal silicide.

5. The method of claim 4, wherein depositing a layer of a second metal above said layer of a first metal comprises depositing a layer comprised of at least one of titanium, cobalt, nickel, and platinum above said layer of a first metal.

6. The method of claim 4, wherein said first layer is comprised of titanium and said second layer is comprised of cobalt.

7. The method of claim 1, wherein heating said transistor to a temperature and for a time sufficient to cause at least said layer of a first metal to form a metal silicide comprises performing a rapid thermal anneal process at a temperature ranging from approximately 650–800° C.

8. A method of forming a metal silicide above a transistor comprised of a gate conductor, a source region and a gate region, the method comprising:
    forming a layer of nitrogen-bearing silicon dioxide selectively above said gate conductor and said source and drain regions by thermally growing a layer of silicon dioxide in the presence of at least one of nitric oxide (NO), nitrous oxide ($NO_2$) and ammonium ($NH_3$);
    depositing a layer of titanium above at least said layer of nitrogen-bearing silicon dioxide; and
    heating said transistor to a temperature ranging from approximately 650–800° C. and for a time sufficient to cause at least said layer of titanium to form titanium silicide.

9. The method of claim 8, further comprising depositing a layer of a second metal comprised of cobalt, nickel, or titanium above said layer of titanium, and wherein heating said transistor comprises heating said transistor to a temperature and for a time sufficient to cause at least said second layer to form a metal silicide.

10. A method of forming a metal silicide above a transistor comprised of a gate conductor, a source region and a gate region, the method comprising:
    forming a layer of nitrogen-bearing silicon dioxide selectively above said gate conductor and said source and drain regions by thermally growing a layer of silicon dioxide in the presence of at least one of nitric oxide (NO), nitrous oxide ($NO_2$) and ammonium ($NH_3$);
    depositing a layer of a first metal above at least said layer of nitrogen-bearing silicon dioxide;
    depositing a layer of a second metal above said layer of a first metal; and
    heating said transistor to a temperature and for a time sufficient to cause at least said layer of a second metal to form a metal silicide.

11. The method of claim 10, wherein depositing a layer of a first metal above at least said layer of nitrogen-bearing silicon dioxide comprises depositing a layer comprised of at least one of titanium, nickel, and platinum above at least said layer of nitrogen-bearing silicon dioxide.

12. The method of claim 10, wherein depositing a layer of a second metal above said layer of a first metal comprises depositing a layer comprised of at least one of titanium, cobalt, nickel, and platinum above said layer of a first metal.

13. The method of claim 10, wherein said first layer is comprised of titanium and said second layer is comprised of cobalt.

14. The method of claim 13, wherein said first layer is approximately 50–100 Å thick and is comprised of titanium and said second layer is approximately 100–200 Å thick and is comprised of cobalt.

15. The method of claim 10, wherein heating said transistor to a temperature and for a time sufficient to cause at least said layer of a second metal to form a metal silicide comprises performing a rapid thermal anneal process at a temperature ranging from approximately 650–800° C.

16. A method of forming a metal silicide above a transistor comprised of a gate conductor, a source region and a gate region, the method comprising:

forming a layer of nitrogen-bearing silicon dioxide above at least said gate conductor and said source and drain regions by thermally growing a layer of silicon dioxide in the presence of at least one of nitric oxide (NO), nitrous oxide ($NO_2$) and ammonium ($NH_3$);

depositing a layer of a first metal comprised of titanium having a thickness of approximately 50–100 Å above at least said layer of nitrogen-bearing silicon dioxide;

depositing a layer of a second metal comprised of cobalt having a thickness ranging from approximately 100–200 Å above said layer of a first metal; and heating said transistor to a temperature ranging from approximately 650–800° C. and for a time sufficient to cause at least said layer of a second metal to form a metal silicide.

* * * * *